United States Patent
Rofougaran et al.

(10) Patent No.: US 8,849,214 B2
(45) Date of Patent: Sep. 30, 2014

(54) METHOD AND SYSTEM FOR POINT-TO-POINT WIRELESS COMMUNICATIONS UTILIZING LEAKY WAVE ANTENNAS

(75) Inventors: Ahmadreza Rofougaran, Newport Coast, CA (US); Maryam Rofougaran, Rpv, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 12/796,862

(22) Filed: Jun. 9, 2010

(65) Prior Publication Data

US 2010/0311333 A1  Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
*H04B 7/00* (2006.01)
*H04B 17/00* (2006.01)
(Continued)

(52) U.S. Cl.
CPC . *G01S 13/06* (2013.01); *H04B 1/04* (2013.01); *H04B 5/0031* (2013.01); *H01Q 13/22* (2013.01); *H01Q 13/20* (2013.01); *H04B 1/0458* (2013.01); *H01Q 15/006* (2013.01); *H01Q 1/2283* (2013.01); *H04B 7/24* (2013.01)
USPC .......................... 455/67.11; 455/69; 455/41.2

(58) Field of Classification Search
CPC ....................... H04B 17/0057; H04W 52/0245
USPC ............... 455/39, 41.1, 41.2, 41.3, 501, 63.1, 455/67.11, 67.13, 69, 71
See application file for complete search history.

(56) References Cited

U.S. PATENT DOCUMENTS 4,701,763 A  10/1987 Yamamoto
5,138,436 A  8/1992 Koepf
(Continued)

FOREIGN PATENT DOCUMENTS

WO  WO 2008/069495  * 12/2008

OTHER PUBLICATIONS

Feresidis et al., "Flat Plate Millimetre Wave Antenna Based on Partially Reflective FSS", 11$^{th}$ International Conference on Antennas and Propagation, 2001, pp. 33-36.

(Continued)

*Primary Examiner* — Andrew Wendell
(74) *Attorney, Agent, or Firm* — Oblon, Spivak, McClelland, Maier & Neustadt, L.L.P.

(57) ABSTRACT

A method and system for point-to-point wireless communications utilizing leaky wave antennas is provided. In this regard, a first device may transmit a RF signal via a leaky wave antenna, and may determine an angle between the leaky wave antenna of the first device and a leaky wave antenna of a second device by adjusting a frequency of the RF signal until a response is received from the second device. The first device may be configured based on the determined angle. A wireless connection may be established between the leaky wave antenna of the first device and the leaky wave antenna of the second device based on the configuration. The first device may generate a notification when the angle is beyond a threshold. The wireless connection may adhere to wireless USB protocols and/or Bluetooth protocols, for example. The second device may generate the response after receiving sufficient energy from the RF signal.

14 Claims, 12 Drawing Sheets

(51) Int. Cl.
  *H04B 1/00* (2006.01)
  *H04B 1/04* (2006.01)
  *H04B 5/00* (2006.01)
  *H01Q 13/22* (2006.01)
  *H01Q 13/20* (2006.01)
  *G01S 13/06* (2006.01)
  *H01Q 1/22* (2006.01)
  *H04B 7/24* (2006.01)
  *H01Q 15/00* (2006.01)

(56) References Cited

U.S. PATENT DOCUMENTS

| | | | |
|---|---|---|---|
| 5,300,875 A | 4/1994 | Tuttle | |
| 5,363,075 A | 11/1994 | Fanucchi | |
| 5,387,885 A | 2/1995 | Chi | |
| 5,717,943 A | 2/1998 | Barker | |
| 5,900,843 A | 5/1999 | Lee | |
| 5,912,598 A | 6/1999 | Stones | |
| 6,005,520 A | 12/1999 | Nalbandian | |
| 6,034,643 A * | 3/2000 | Nishikawa et al. | 343/765 |
| 6,037,743 A | 3/2000 | White | |
| 6,127,799 A | 10/2000 | Krishnan | |
| 6,212,431 B1 | 4/2001 | Hahn | |
| 6,285,325 B1 | 9/2001 | Nalbandian | |
| 6,340,951 B1 * | 1/2002 | Sheen | 343/700 MS |
| 6,597,323 B2 | 7/2003 | Teshirogi | |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,885,847 B1 * | 4/2005 | Lumelsky | 455/41.2 |
| 6,954,236 B1 | 10/2005 | Russell | |
| 7,002,517 B2 | 2/2006 | Noujeim | |
| 7,020,701 B1 | 3/2006 | Gelvin | |
| 7,023,374 B2 | 4/2006 | Jossef | |
| 7,084,823 B2 | 8/2006 | Caimi | |
| 7,253,780 B2 | 8/2007 | Sievenpiper | |
| 7,268,517 B2 | 9/2007 | Rahmel | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,394,288 B1 | 7/2008 | Agarwal | |
| 7,535,958 B2 | 5/2009 | Best | |
| 7,592,957 B2 | 9/2009 | Achour | |
| 7,620,424 B2 | 11/2009 | Cetiner | |
| 7,733,265 B2 | 6/2010 | Margomenos | |
| 7,855,696 B2 | 12/2010 | Gummalla | |
| 7,860,535 B2 * | 12/2010 | Kuramoto et al. | 455/562.1 |
| 8,195,103 B2 | 6/2012 | Waheed | |
| 8,242,957 B2 | 8/2012 | Rofougaran | |
| 8,285,231 B2 | 10/2012 | Rofougaran | |
| 8,295,788 B2 | 10/2012 | Rofougaran | |
| 8,299,971 B2 | 10/2012 | Talty | |
| 2002/0000936 A1 | 1/2002 | Sheen | |
| 2002/0005807 A1 | 1/2002 | Sheen | |
| 2002/0041256 A1 | 4/2002 | Saitou | |
| 2002/0135568 A1 | 9/2002 | Chen | |
| 2003/0122729 A1 | 7/2003 | Diaz | |
| 2004/0066251 A1 | 4/2004 | Eleftheriades | |
| 2004/0203944 A1 | 10/2004 | Huomo | |
| 2004/0224657 A1 * | 11/2004 | Matsusaka | 455/278.1 |
| 2004/0227668 A1 | 11/2004 | Sievenpiper | |
| 2004/0263378 A1 | 12/2004 | Jossef | |
| 2004/0263408 A1 | 12/2004 | Sievenpiper | |
| 2005/0012667 A1 * | 1/2005 | Noujeim | 343/700 MS |
| 2005/0052424 A1 | 3/2005 | Shih | |
| 2005/0116864 A1 | 6/2005 | Mohamadi | |
| 2005/0134579 A1 | 6/2005 | Hsieh | |
| 2005/0136972 A1 * | 6/2005 | Smith et al. | 455/554.1 |
| 2005/0250542 A1 * | 11/2005 | Aoyama et al. | 455/562.1 |
| 2006/0046638 A1 * | 3/2006 | Takeuchi et al. | 455/3.02 |
| 2006/0066326 A1 | 3/2006 | Slupsky | |
| 2006/0077918 A1 * | 4/2006 | Mao et al. | 370/310 |
| 2006/0109127 A1 | 5/2006 | Barink | |
| 2006/0125703 A1 | 6/2006 | Ma | |
| 2006/0281423 A1 | 12/2006 | Caimi | |
| 2007/0152871 A1 * | 7/2007 | Puglia | 342/70 |
| 2007/0171076 A1 | 7/2007 | Stevens | |
| 2007/0190952 A1 | 8/2007 | Waheed | |
| 2007/0197186 A1 * | 8/2007 | Muqattash et al. | 455/343.1 |
| 2007/0273607 A1 | 11/2007 | Chen | |
| 2007/0285248 A1 | 12/2007 | Hamel | |
| 2007/0287403 A1 | 12/2007 | Sjoland | |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258981 A1 | 10/2008 | Achour | |
| 2008/0278400 A1 | 11/2008 | Lohninger | |
| 2008/0284085 A1 | 11/2008 | Curina | |
| 2008/0316135 A1 | 12/2008 | Hilgers | |
| 2009/0108996 A1 | 4/2009 | Day | |
| 2009/0140921 A1 * | 6/2009 | Bongfeldt et al. | 342/372 |
| 2009/0153250 A1 | 6/2009 | Rofougaran | |
| 2009/0153421 A1 | 6/2009 | Rofougaran | |
| 2009/0153427 A1 | 6/2009 | Rofougaran | |
| 2009/0153428 A1 | 6/2009 | Rofougaran | |
| 2009/0156157 A1 | 6/2009 | Rofougaran | |
| 2009/0160612 A1 | 6/2009 | Varpula | |
| 2009/0243740 A1 | 10/2009 | Rofougaran | |
| 2009/0243741 A1 | 10/2009 | Rofougaran | |
| 2009/0243742 A1 | 10/2009 | Rofougaran | |
| 2009/0243767 A1 | 10/2009 | Rofougaran | |
| 2009/0243779 A1 | 10/2009 | Rofougaran | |
| 2009/0247109 A1 | 10/2009 | Rofougaran | |
| 2009/0251362 A1 | 10/2009 | Margomenos | |
| 2009/0278596 A1 | 11/2009 | Rofougaran | |
| 2009/0279593 A1 | 11/2009 | Rofougaran | |
| 2009/0280768 A1 | 11/2009 | Rofougaran | |
| 2010/0048143 A1 * | 2/2010 | Wendler et al. | 455/67.13 |
| 2010/0073246 A1 * | 3/2010 | Oh et al. | 343/703 |
| 2010/0110943 A2 | 5/2010 | Gummalla | |
| 2010/0222105 A1 | 9/2010 | Nghiem | |
| 2010/0240317 A1 * | 9/2010 | Giles et al. | 455/67.13 |
| 2010/0308668 A1 | 12/2010 | Rofougaran | |
| 2010/0308767 A1 | 12/2010 | Rofougaran | |
| 2010/0308885 A1 | 12/2010 | Rofougaran | |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 | 12/2010 | Rofougaran | |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Rofougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 | 12/2010 | Rofougaran | |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 | 12/2010 | Rofougaran | |
| 2010/0311493 A1 | 12/2010 | Miller | |

(56) References Cited

U.S. PATENT DOCUMENTS

2012/0095531 A1 4/2012 Derbas
2012/0153731 A9 6/2012 Kirby
2012/0263256 A1 10/2012 Waheed

OTHER PUBLICATIONS

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity Antennas", Electronics Letters, 2007.

Kimoto et al., "On-Chip Wireless Signal Transmission using Silicon Integrated Antennas", Measurement 40, No. 30, (2004): 20.

Iyer et al., "Wireless chip to chip interconnections for multichip modules using leaky wave antennas", Nov. 1993, pp. 2030-2203].

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

Floyd et al., "Wireless Interconnects for Clock Distribution", pp. 105-108.

Zvolensky et al., "Leaky-Wave antenna based on micro-electromechanical systems-loaded microstrip line", 2011, pp. 357-363.

* cited by examiner

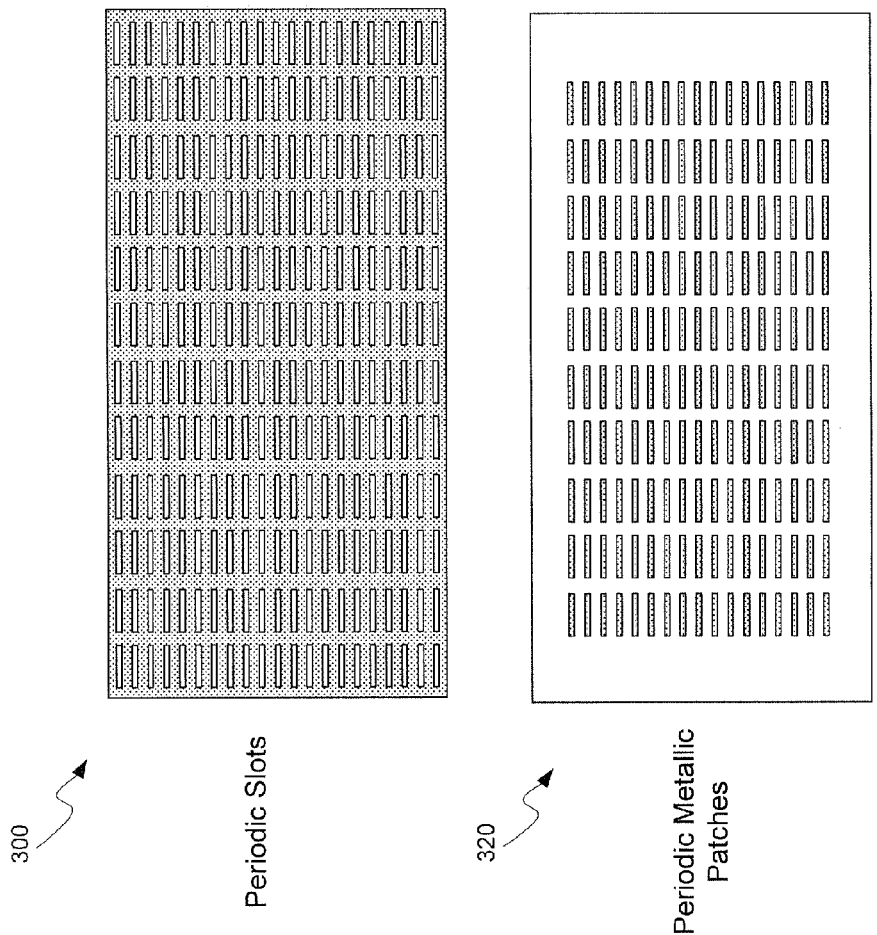

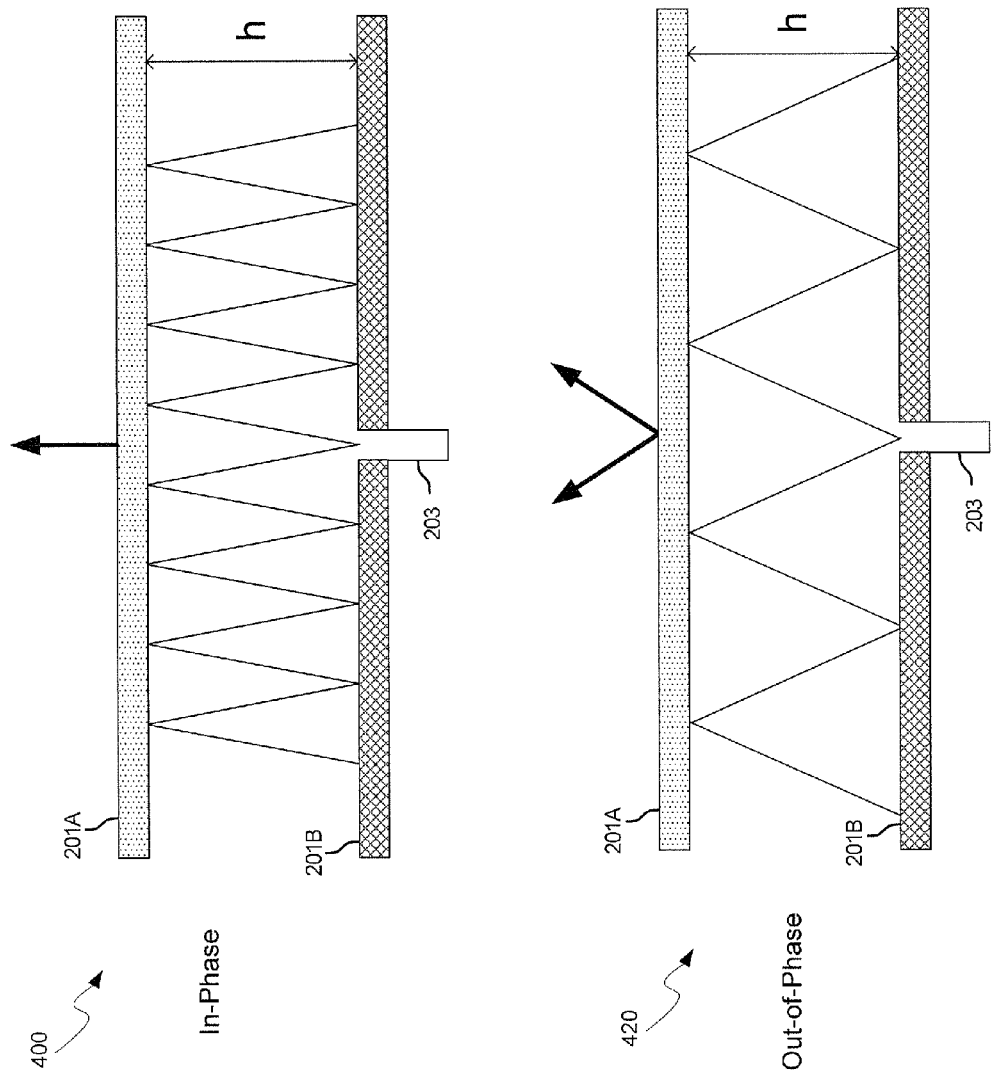

METHOD AND SYSTEM FOR POINT-TO-POINT WIRELESS COMMUNICATIONS UTILIZING LEAKY WAVE ANTENNAS

CLAIM OF PRIORITY

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

Each of the above stated applications is hereby incorporated herein by reference in its entirety.

INCORPORATION BY REFERENCE

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009;
U.S. patent application Ser. No. 12/650,324 filed on Dec. 30, 2009;
U.S. patent application Ser. No. 12/708,366 filed on Feb. 18, 2010;
U.S. patent application Ser. No. 12/751,550 filed on Mar. 31, 2010;
U.S. patent application Ser. No. 12/751,768 filed on Mar. 31, 2010;
U.S. patent application Ser. No. 12/751,759 filed on Mar. 31, 2010;
U.S. patent application Ser. No. 12/751,593 filed on Mar. 31, 2010;
U.S. patent application Ser. No. 12/751,772 filed on Mar. 31, 2010;
U.S. patent application Ser. No. 12/751,777 filed on Mar. 31, 2010;
U.S. patent application Ser. No. 12/751,782 filed on Mar. 31, 2010;
U.S. patent application Ser. No. 12/751,792 filed on Mar. 31, 2010;
U.S. patent application Ser. No. 12/751,751 filed on Mar. 31, 2010;
U.S. patent application Ser. No. 12/790,279 filed on May 28, 2010;
U.S. patent application Ser. No. 12/797,029 filed on Jun. 9, 2010;
U.S. patent application Ser. No. 12/797,068 filed on Jun. 9, 2010;
U.S. patent application Ser. No. 12/797,133 filed on Jun. 9, 2010;
U.S. patent application Ser. No. 12/797,162 filed on Jun. 9, 2010;
U.S. patent application Ser. No. 12/797,177 filed on Jun. 9, 2010;
U.S. patent application Ser. No. 12/797,203 filed on Jun. 9, 2010;
U.S. patent application Ser. No. 12/796,822 filed on Jun. 9, 2010;
U.S. patent application Ser. No. 12/797,214 filed on Jun. 9, 2010;
U.S. patent application Ser. No. 12/796,841 filed on Jun. 9, 2010;
U.S. patent application Ser. No. 12/797,232 filed on Jun. 9, 2010;
U.S. patent application Ser. No. 12/796,975 filed on Jun. 9, 2010;
U.S. patent application Ser. No. 12/797,041 filed on Jun. 9, 2010;
U.S. patent application Ser. No. 12/797,112 filed on Jun. 9, 2010;
U.S. patent application Ser. No. 12/797,254 filed on Jun. 9, 2010;
U.S. patent application Ser. No. 12/797,273 filed on Jun. 9, 2010; and
U.S. patent application Ser. No. 12/797,316 filed on Jun. 9, 2010.

Each of the above stated applications is hereby incorporated herein by reference in its entirety.

FIELD OF THE INVENTION

Certain embodiments of the invention relate to wireless communication. More specifically, certain embodiments of the invention relate to a method and system for point-to-point wireless communications utilizing leaky wave antennas.

BACKGROUND OF THE INVENTION

As computers and electronic devices become more and more ubiquitous, deciding on the best way to interconnect the various devices becomes a challenge. In this regard, wired communications protocols provide the advantage that they are often high speed and low cost, but the drawback is the unsightly and cumbersome e mess of wires that often results. On the other hand, wireless communications protocols eliminate the tangled mess of wires but have the drawback that, as more and more wireless devices and wireless communication protocols are put in to use, noise and interference between the devices becomes increasingly troublesome.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for point-to-point wireless communications utilizing leaky wave antennas as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 3 is a block diagram illustrating a plan view of exemplary partially reflective surfaces for a leaky wave antenna, in accordance with an embodiment of the invention.

FIG. 4A is a block diagram illustrating an exemplary phase dependence of a leaky wave antenna, in accordance with an embodiment of the invention.

DETAILED DESCRIPTION OF THE INVENTION

Certain aspects of the invention may be found in a method and system for point-to-point wireless communications utilizing leaky wave antennas. In various embodiments of the invention, a first device may transmit a RF signal via a leaky wave antenna, and may determine an angle between the leaky wave antenna of the first device and a leaky wave antenna of a second device by adjusting a frequency of the transmitted RF signal until a response is received from the second device. The first device may be configured based on the determined angle. A wireless connection may be established between the leaky wave antenna of the first device and the leaky wave antenna of the second device based on the configuration. The radio frequency signal may be at or near 60 GHz. Each of the leaky wave antennas may be integrated within and/or on an integrated circuit and/or an integrated circuit package. The first device may generate a notification when the angle is beyond a threshold. The wireless connection may adhere to wireless USB protocols and/or Bluetooth protocols. Configuring the first device may comprise tuning one or more filters. The second device may generate the response after receiving sufficient energy from the RF signal. The second device may configure one or more filters based on received signal strength of the RF signal.

Figure 1A:
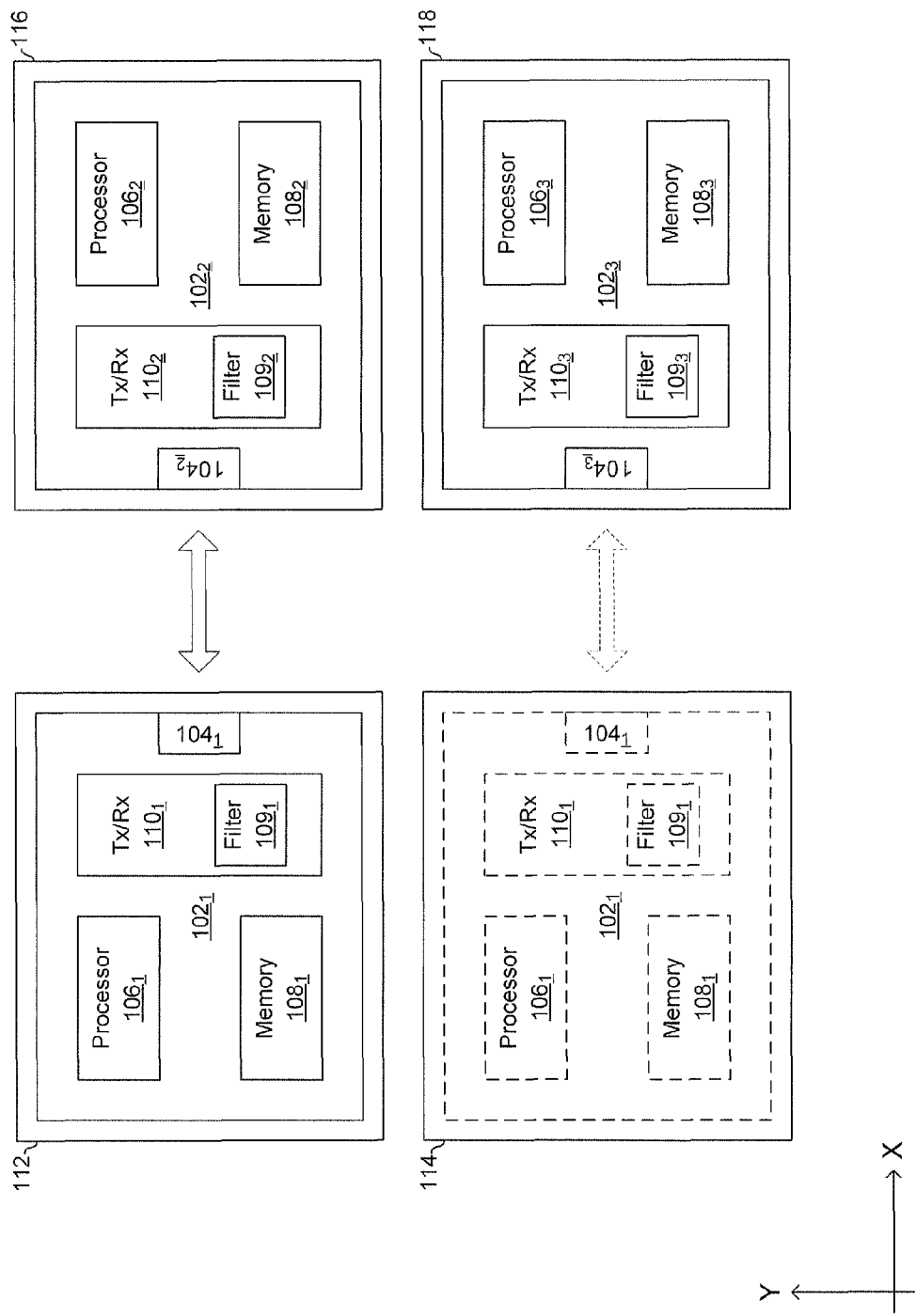
FIG. 1A is a block diagram illustrating devices operable to communicate over a point-to-point communication link via leaky wave antennas, in accordance with an embodiment of the invention.

FIG. 1A is a block diagram illustrating devices operable to communicate over a point-to-point communication link via leaky wave antennas, in accordance with an embodiment of the invention. Referring to FIG. 1A, there is shown a device $102_1$ which may be in location 112 or location 114, device $102_2$ in location 116, and a device $102_3$ in location 118. Any of the devices $102_1$-$102_3$ is referred to generically as $102_N$. Each device $102_N$ comprises a processor $106_N$, a memory $108_N$, a transmitter and/or receiver $110_N$, and a leaky wave antenna $104_N$. For reference, a coordinate system is also shown. In this regard, locations 112 and 116 are aligned in the Y direction and locations 114 and 118 are aligned in the Y direction.

Each processor $106_N$ may comprise suitable logic, circuitry, interface(s), and/or code that may be operable to perform various aspects of the invention. Each processor $106_N$ may be operable to execute instructions, process data, generate control signals, control data transfers, and/or otherwise control operation of the device $102_N$. In performing its functions, the processor $106_N$ may utilize the memory $108_N$. For example, instructions executed by the processor $106_N$ may be stored in the memory $108_N$ and data processed and/or to-be-processed by the processor $106_N$ may be stored in the memories $108_N$.

The transmitter and/or receiver (Tx/Rx) $110_N$ may comprise suitable logic, circuitry, interface(s), and/or code that may be operable to perform various aspects of the invention. The Tx/Rx $110_N$ may be operable to receive baseband signals from the processor $106_N$, modulate the baseband signal onto an RF signal, and transmit the modulated RF signal. The Tx/Rx $110_N$ may be operable to receive signals via the leaky wave antenna $104_N$. The Tx/Rx $110_N$ may be operable to detect received signal energy and generate one or more signals that indicate an amount of energy received. The Tx/Rx $110_N$ may be operable to control a phase of a transmitted signal to control the radiation pattern of the leaky wave antenna $104_N$, as is described below with respect to FIGS. 4A, 4B, and 5. The Tx/Rx block $110_N$ may comprise one or more filters $109_N$ for selecting a frequency at which the device $102_N$ transmits and/or receives. The frequency may also impact the radiation pattern of the leaky wave antenna $104_N$.

In operation, the device $102_1$ may attempt to detect other devices by transmitting a page or pilot signal. Upon detecting the page or pilot signal, the device $102_2$ may power up the Tx/Rx $110_2$ and may transmit a response signal via the leaky wave antenna $104_2$. The devices $102_1$ and $102_2$ may subsequently establish a wireless connection and data communications between the devices $102_1$ and $102_2$ may begin. The directivity of the leaky wave antennas $104_1$-$104_3$ may be such that when the device $102_1$ is in the location 112, then the device $102_3$ may not detect the page or pilot signal transmitted by the device $102_1$. Similarly, when the device $102_1$ is moved to location 114, a connection may be established between the devices $102_1$ and $102_3$ without the device $102_2$ being experiencing significant interference from, and perhaps not even aware of, the communications between the devices $102_1$ and $102_3$.

In this manner, devices 102 may operate in close proximity to one another with little interference between devices 102. As a result, point-to-point communication utilizing the leaky wave antennas 104 may reduce the need for complex circuitry to deal with interference. Furthermore, point-to-point communication utilizing the leaky wave antennas 104 may reduce the need for algorithms and/or protocols that deal with device enumeration and/or pairing when attempting to establish a connection. In this regard, device pairing may be determined by physical location of the devices. That is, when the leaky wave antennas are sufficiently aligned then a connection may be established and when they are not sufficiently aligned then no connection may be established.

Figure 1B:
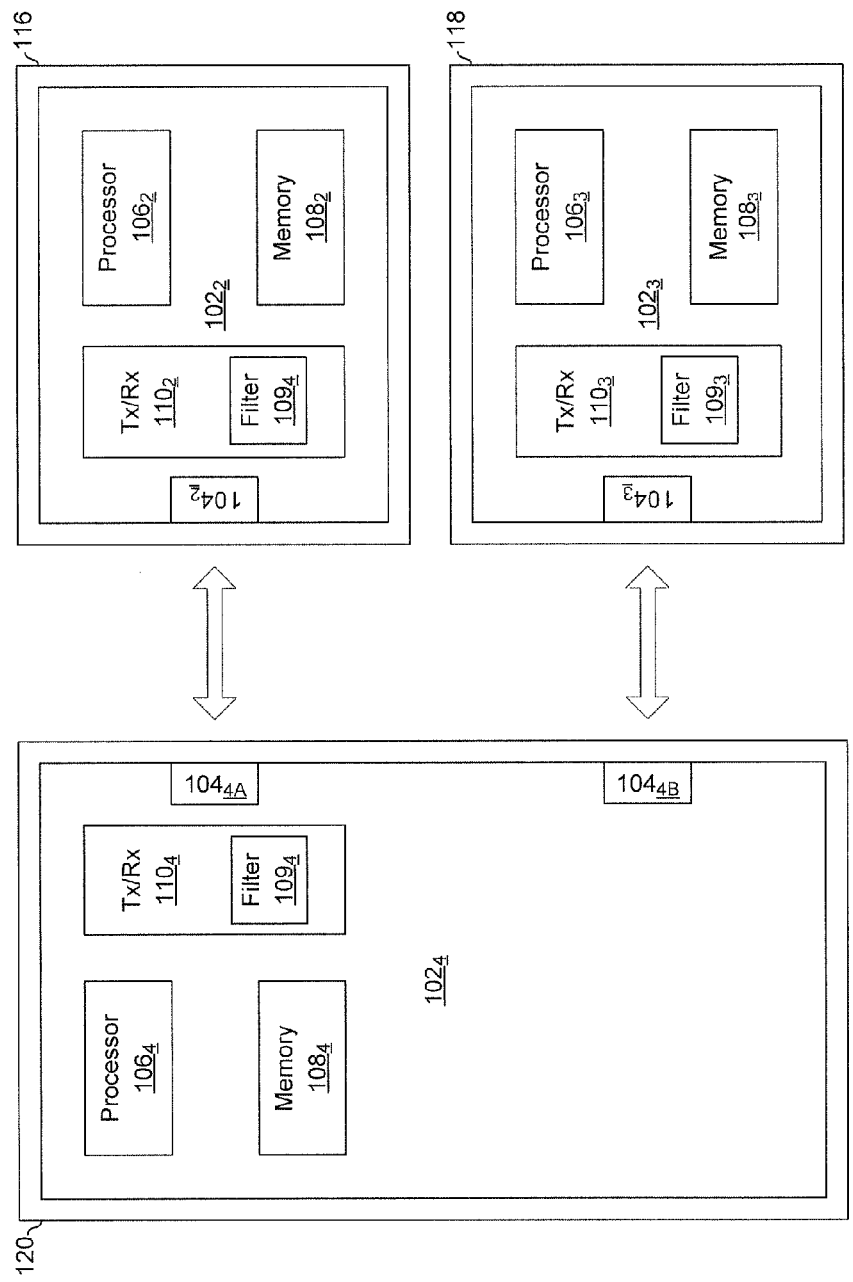
FIG. 1B is a block diagram illustrating devices operable to communicate over a point-to-point communication link via leaky wave antennas, in accordance with an embodiment of the invention.

FIG. 1B is a block diagram illustrating devices operable to communicate over a point-to-point communication link via leaky wave antennas, in accordance with an embodiment of the invention. FIG. 1B differs from FIG. 1A in that the device $102_4$ comprises two leaky wave antennas $104_{4A}$ and $104_{4B}$ and is operable to concurrently communicate with two other devices via the antennas $104_{4A}$ and $104_{4B}$. In this regard, the directivity of the leaky wave antennas $104_{4A}$, $104_{4B}$, $104_2$, and $104_3$ may enable the device $102_4$ to concurrently communicate with devices $102_2$ and $102_3$ without one connection interfering with the other.

Figure 2:
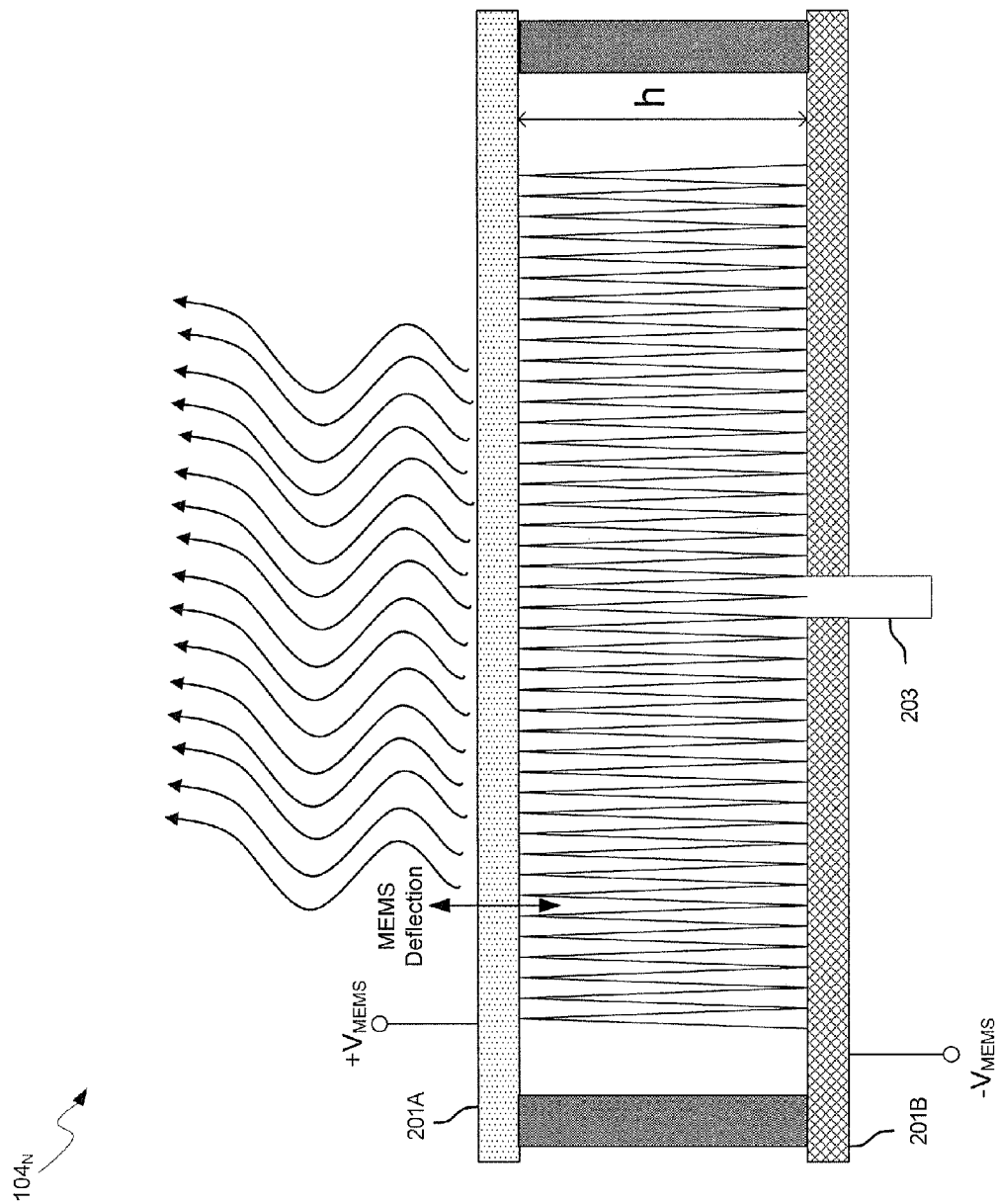
FIG. 2 is a cross-sectional view of an exemplary leaky wave antenna, in accordance with an embodiment of the invention.

FIG. 2 is a cross-sectional view of an exemplary leaky wave antenna, in accordance with an embodiment of the invention. Referring to FIG. 2A, there is shown the leaky wave antenna 202 which may be similar to or the same as the antennas 104 described with respect to FIGS. 1A and 1B. The antenna 202 comprises a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of optimal transmission and reception of the leaky wave antenna 202. In another embodiment of the invention, an air gap may be integrated in the space between the partially reflective surface 201A and the reflective surface 201B to enable MEMS actuation. There is also shown MEMS bias voltage, $+V_{MEMS}$ and $-V_{MEMS}$.

The feed point 203 may comprise a terminal for applying an input voltage to the leaky wave antenna 202 and/or coupling received signals from the antenna 202 to other circuitry. The invention is not limited to a single feed point 203, as is described with respect to FIG. 6.

In an embodiment of the invention, the height, h, may be one-half the wavelength of the desired transmitted mode from the leaky wave antenna 202. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antenna 202. The input impedance of the leaky wave antenna 202 may be configured by the vertical placement of the feed point 203, as described further in FIG. 6.

In operation, a received signal may pass through the surface 201A and be reflected back and forth between the surface 201A and 201B. Since the cavity height is half of the wavelength of the signal to be received, waves incident on the feed point will have traveled an integer multiple of a full wavelength, and thus constructive interference may result and a resonant mode may thereby be established. The resonant mode may enable the leaky wave antenna 202 to provide relatively high gain without the need for a large array of antennas or a complex feed network. In various embodiments of the invention, the cavity height of the leaky wave antenna 202 may be configured by MEMS actuation. For example, the bias voltages $+V_{MEMS}$ and $-V_{MEMS}$ may deflect one or both of the reflective surfaces 201A and 201B compared to zero bias, thereby configuring the height of the cavity and thus the resonant frequency of the cavity.

FIG. 3 is a block diagram illustrating a plan view of exemplary partially reflective surfaces for a leaky wave antenna, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas. In an embodiment of the invention, the slots/patches may be configured via CMOS and/or micro-electromechanical system (MEMS) to tune the Q of the resonant cavity.

FIG. 4A is a block diagram illustrating an exemplary phase dependence of a leaky wave antenna, in accordance with an embodiment of the invention. Referring to FIG. 4A, there is shown a leaky wave antenna 104 comprising the partially reflective surface 201A, the reflective surface 201B, and the feed point 203. In-phase condition 400 illustrates the relative beam shape transmitted by the leaky wave antenna when the frequency of the signal communicated to the feed point 203 matches that of the resonant cavity as defined by the cavity height, h, and the dielectric constant of the material between the reflective surfaces. Similarly, out-of-phase condition 420 illustrates the relative beam shape transmitted by the leaky wave antenna when the frequency of the signal communicated to the feed point 203 does not match that of the resonant cavity. The resulting beam shape may be conical, as opposed to a single main vertical node. These are illustrated further with respect to FIG. 5.

By configuring the leaky wave antenna 104 for in-phase and out-of-phase conditions, signals possessing different characteristics may be directed in desired directions. In an exemplary embodiment of the invention, the angle at which signals may be transmitted or received by a leaky wave antenna 104 may be dynamically controlled so that signal may be directed to desired receiving leaky wave antennas. In another embodiment of the invention, the leaky wave antenna 104 may be operable to receive RF signals, such as 60 GHz signals, for example. The direction in which the signals are received may be configured by the in-phase and out-of-phase conditions.

Figure 4B:
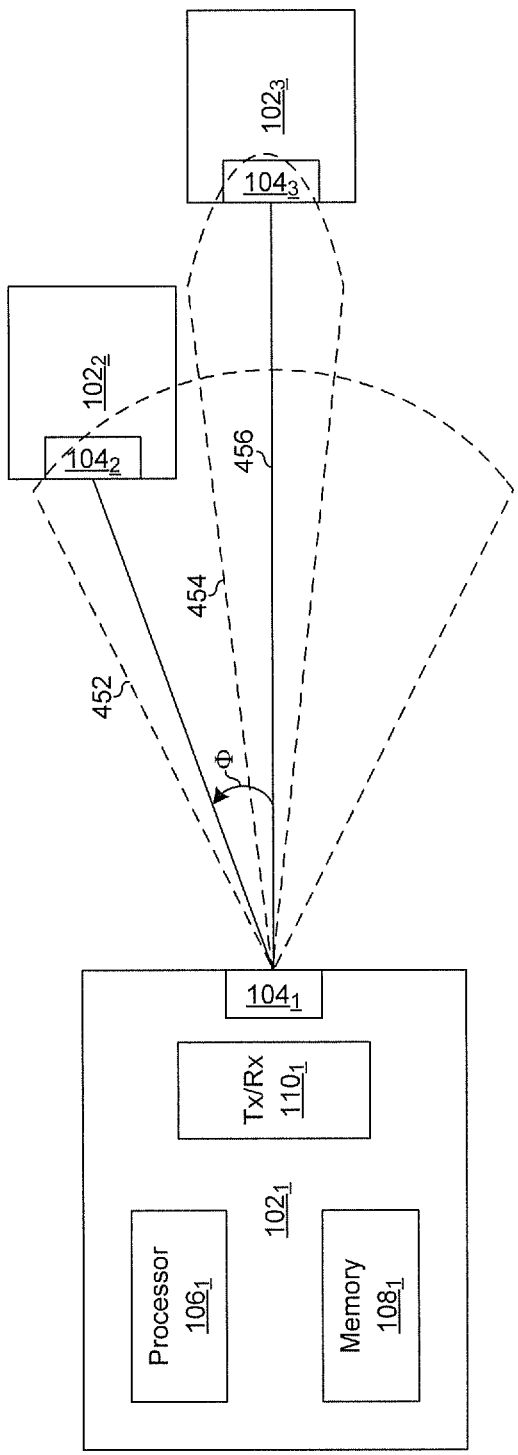
FIG. 4B is a block diagram illustrating controlling radiation pattern of a leaky wave antenna for establishing point-to-point communication, in accordance with an embodiment of the invention.

FIG. 4B is a block diagram illustrating controlling radiation pattern of a leaky wave antenna for establishing point-to-point communication, in accordance with an embodiment of the invention. Referring to FIG. 4B there is shown the devices $102_1$-$102_3$ in a different physical arrangement than in FIGS. 1A and 1B. The angle between the devices $102_1$ and $102_3$ may be 0° measured from the X axis 456 and the angle between the devices $102_1$ and $102_2$ may be Φ degrees measured from the X axis 456.

In FIG. 4B, a first phase condition in the device $102_1$, corresponding to a first transmit and/or receive frequency, may result in the radiation pattern 454 and a second phase condition in the device $102_2$, corresponding to a second transmit and/or receive frequency, may result in the radiation pattern 452.

In instances that the device $102_1$ is configured for the radiation pattern 454, a connection may be established between the device $102_1$ and the device $102_3$. In this regard, the radiation pattern 454 may result in sufficient energy being received by the device $102_3$ to trigger the device $102_3$ to power up and connect with the device $102_1$. Conversely, the device $102_2$ may receive little or no power from the device $102_1$ while the device $102_1$ is configured for radiation pattern 454, and thus the device $102_2$ may not be triggered to power up.

In instances that the device $102_1$ is configured for the radiation pattern 452, a connection may be established between the device $102_1$ and the device $102_2$. In this regard, the radiation pattern 452 may result in the device $102_2$ receiving sufficient energy to trigger it to power up and connect with the device $102_1$. Conversely, the device $102_3$ may receive little or no power from the device $102_1$ while the device $102_1$ is configured for radiation pattern 452, and thus the device $102_2$ may not be triggered to power up.

In various embodiments of the invention, one or more frequency selective filters 109 may enable further reduction of interference between wireless connection in close physical proximity. In this regard, the device $102_3$ may comprise a filter $109_3$ tuned to the first frequency and the device $102_2$ may comprise a filter $109_2$ tuned to the second frequency. Such filters 109 may be configured manually or automatically by a system administrator. For example, the administrator may configure the filter $109_3$ to select the frequency corresponding to the 0° angle and configure the filter $109_2$ to select the frequency corresponding to the angle Φ. Additionally or alternatively, the filters $109_2$ and $109_3$ may be configured dynamically by, for example, the devices $102_2$ and $102_3$ measuring received signals strength over a range of frequencies and configuring the filters $109_2$ and $109_3$ to the frequency for which the strongest signal was received by the devices $102_2$ and $102_3$, respectively.

In an exemplary embodiment of the invention, the device $102_1$ may attempt to discover communication partners by initially transmitting a discovery signal at a frequency that corresponds to a 0° angle and adjusting the signal to gradually increase the angle until a response from a communication device is detected or until a maximum angle is reached. If a maximum angle is reached without discovering a communication partner, the devices may be insufficiently aligned. In this regard, if the device $102_3$ is present and enabled to communicate, then the device $102_1$ may quickly discover the device $102_3$ upon beginning to transmit at the frequency corresponding to an angle of 0°. On the other hand, in instances that the device $102_3$ is not present, the device $102_1$ may adjust the frequency until reaching the frequency corresponding to the angle Φ, at which time the device $102_2$ may be discovered. In this manner, aspects of the invention may be utilized for determining physical alignment of communication devices. For example, the device $102_1$ may be operable to generate a flag and/or notification to a main controller, user and/or system administrator upon detecting that the angle Φ is above or below a threshold.

In various embodiments of the invention, once the device $102_1$ discovers a communication partner, a connection may be established between the two devices. The connection may utilize proprietary protocols and/or existing protocols such as wireless USB and/or Bluetooth.

Figure 5:
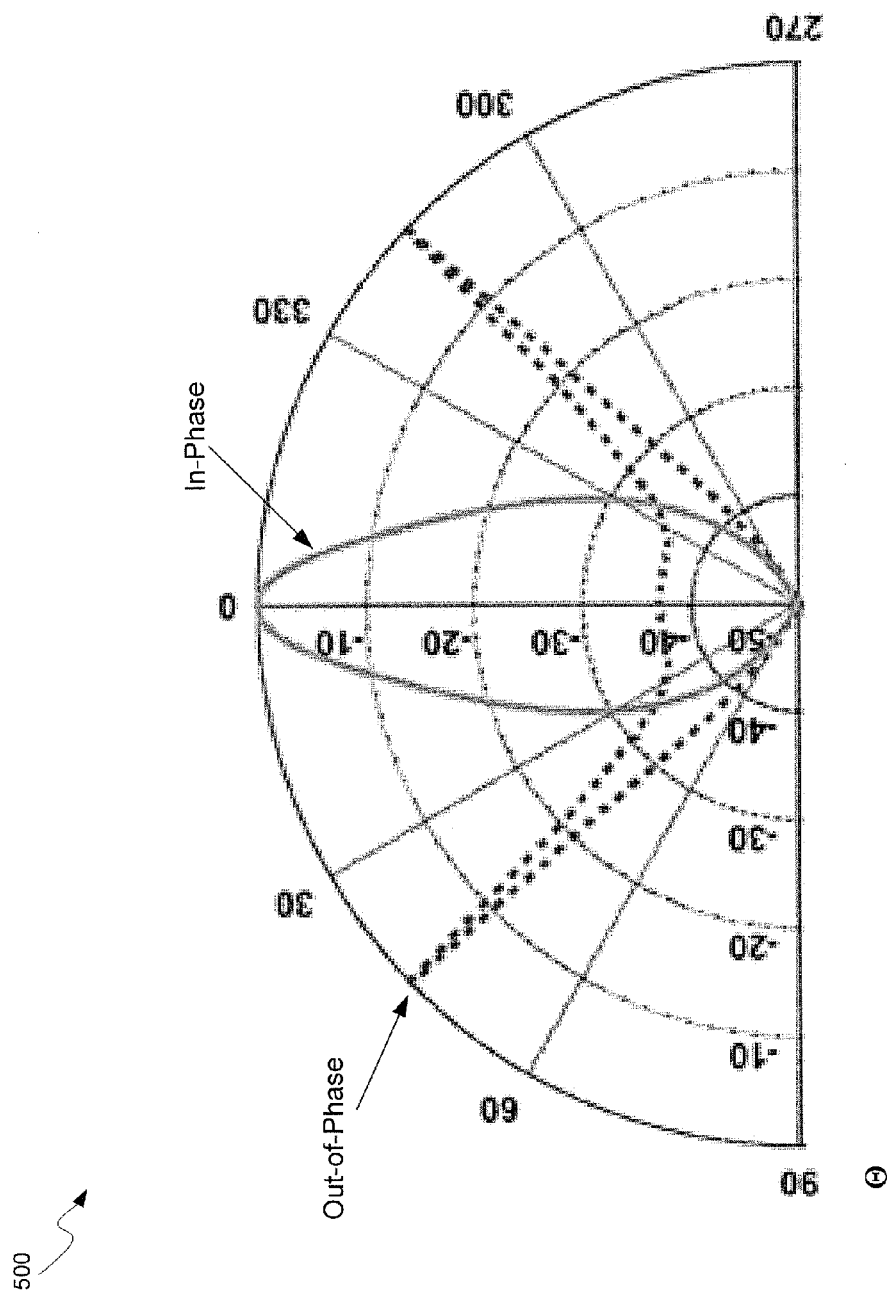
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, Θ, for the in-phase and out-of-phase conditions for a leaky wave antenna 104.

The In-phase curve in the plot 500 may correlate to the case where the frequency of the signal communicated to a leaky wave antenna 104 matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, the leaky wave antenna 104 may be configured to receive signals from a desired direction via the in-phase and out-of-phase configurations.

Figure 6:
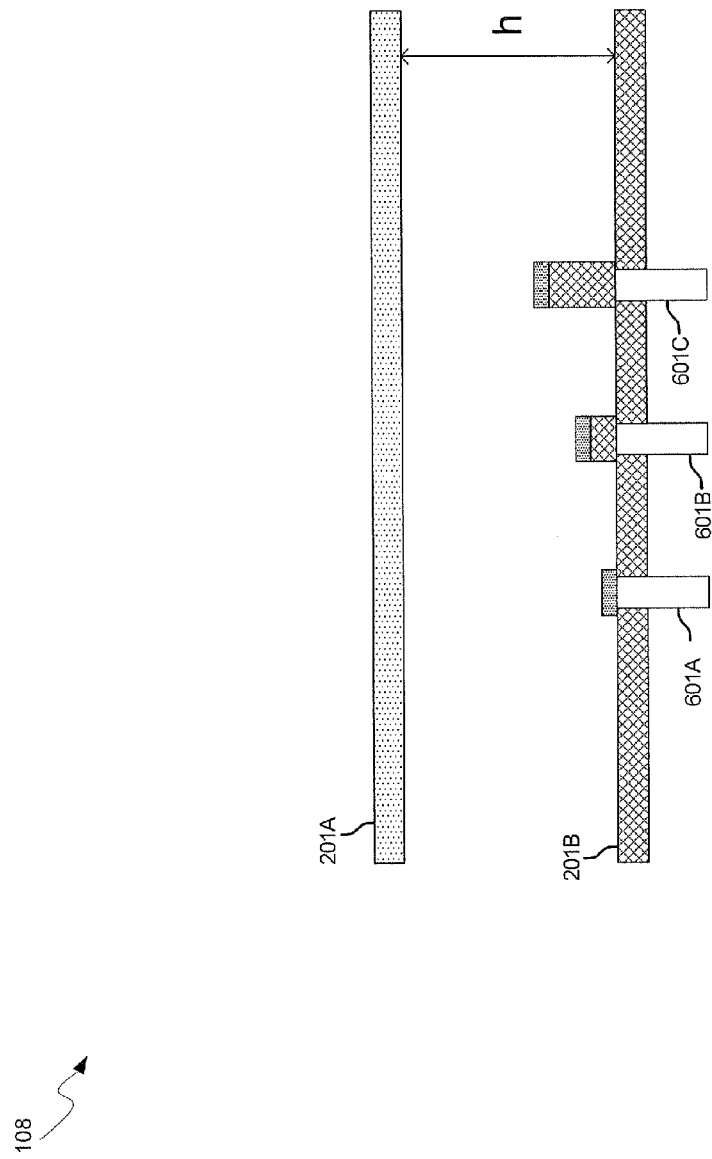
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 104 comprising the partially reflective surface 201A and the reflective surface 201B. There is also shown feed points 601A-601C. The feed points 601A-601C may be located at different positions along the height of the cavity thereby configuring different impedance points for the leaky wave antenna 104. Accordingly, a device 102 may select, via one or more switches and/or micro-electromechanical systems (MEMS), between the various feed points 601A, 601B, and 601C to control an input impedance. In this manner, the amplitude of a backscattered signal 107 may be modulated by switching between two or more feed points of a leaky wave antenna.

Figure 7:
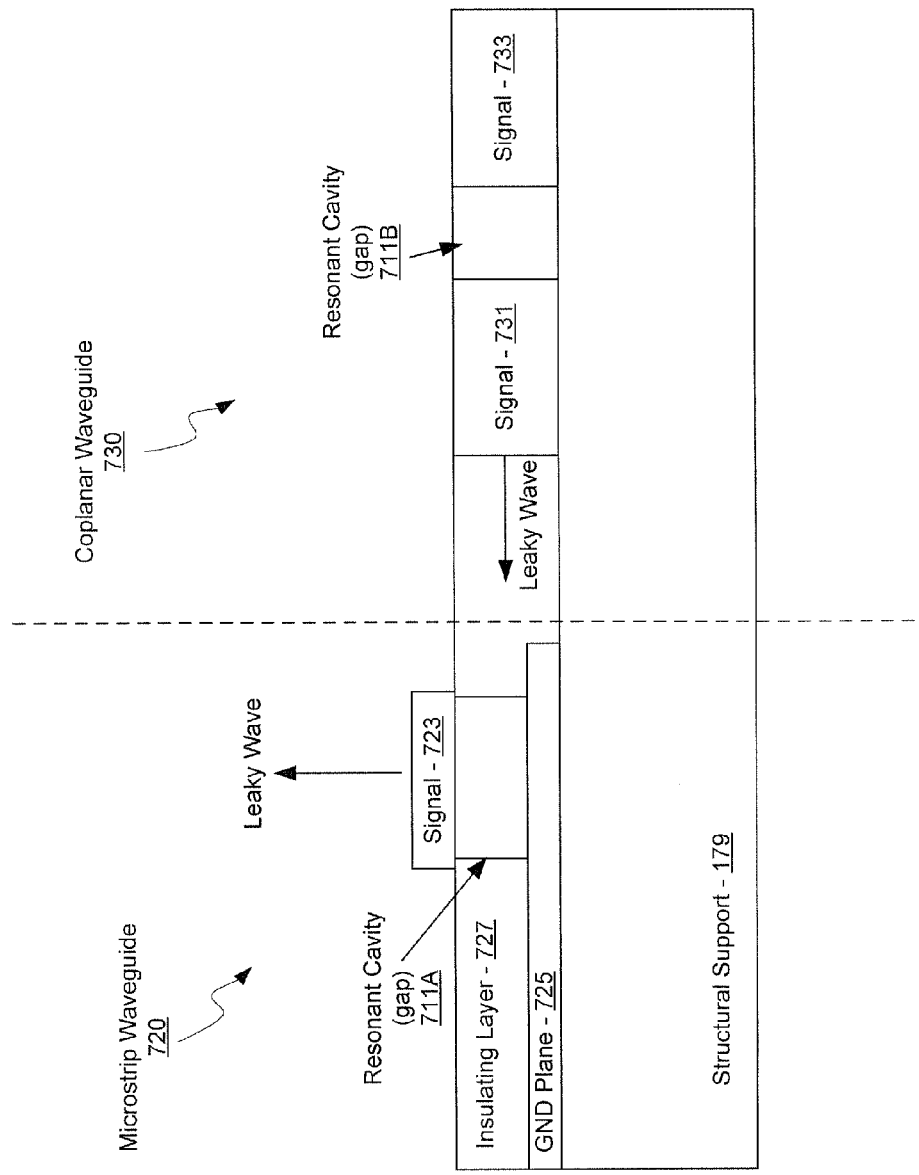
FIG. 7 is a block diagram illustrating a cross-sectional view of coplanar and microstrip waveguides, in accordance with an embodiment of the invention.

FIG. 7 is a block diagram illustrating a cross-sectional view of coplanar and microstrip waveguides, in accordance with an embodiment of the invention. Referring to FIG. 7, there is shown a microstrip waveguide 720 and a coplanar waveguide 730. The microstrip waveguide 720 may comprise signal conductive lines 723, a ground plane 725, a gap 711A, an insulating layer 727 and a support structure 729 which may be a semiconductor substrate, a ceramic IC package, plastic, and/or a dielectric material. The coplanar waveguide 730 may comprise signal conductive lines 731 and 733, a gap 711B, the insulating layer 727, and the support structure 729.

The signal conductive lines 723, 731, and 733 may comprise metal traces or layers deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The insulating layer 727 may comprise $SiO_2$ or other insulating material that may provide a high resistance layer between the signal conductive line 723 and the ground plane 725, and the signal conductive lines 731 and 733. In addition, the electric field between the signal conductive line 723 and the ground plane 725 may be dependent on the dielectric constant of the insulating layer 727.

The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the distance between signal conductive lines 731 and 733, for example. In an exemplary embodiment of the invention, the insulating layer 727 may be removed in localized regions in the microstrip waveguide 720 and the coplanar waveguide 730 to configure the gaps 711A and 711B, thereby allowing for MEMS deflection of the conductive layers and configuring of the height of the resonant cavity.

The signal conductive lines 731 and 733, and the signal conductive line 723 and the ground plane 725 may define resonant cavities 711A and 711B, respectively, for leaky wave antennas 104. Each layer may comprise a reflective surface or a partially reflective surface depending on the pattern of conductive material. For example, a partially reflective surface may be configured by alternating conductive and insulating material in a 1-dimensional or 2-dimensional pattern. In this manner, signals may be directed out of, or received into, a surface of the transponder 100, as illustrated with the microstrip waveguide 720.

The structural support 179 may provide mechanical support for the microstrip waveguide 720, the coplanar waveguide 730, and other devices that may be integrated within. In various embodiment of the invention, the structural support 179 may comprise Si, GaAs, sapphire, InP, GaO, ZnO, CdTe, CdZnTe, ceramics, polytetrafluoroethylene, and/or $Al_2O_3$, for example, or any other substrate material.

In operation, a bias and/or a signal voltage may be applied across the signal conductive line 723 and the ground plane 725, and/or the signal conductive lines 731 and 733. The thickness of a leaky wave antenna resonant cavity may be dependent on the distance between the conductive lines in the microstrip waveguide 720 and/or the coplanar transmission waveguide 730.

By alternating patches of conductive material with insulating material, or slots of conductive material in dielectric material, a partially reflective surface may result, which may allow a signal to "leak out" in that direction, as shown by the Leaky Wave arrows in FIG. 7. In this manner, wireless signals may be directed out of the surface plane of the chip 162, or parallel to the surface of the structural support 179.

Figure 8:
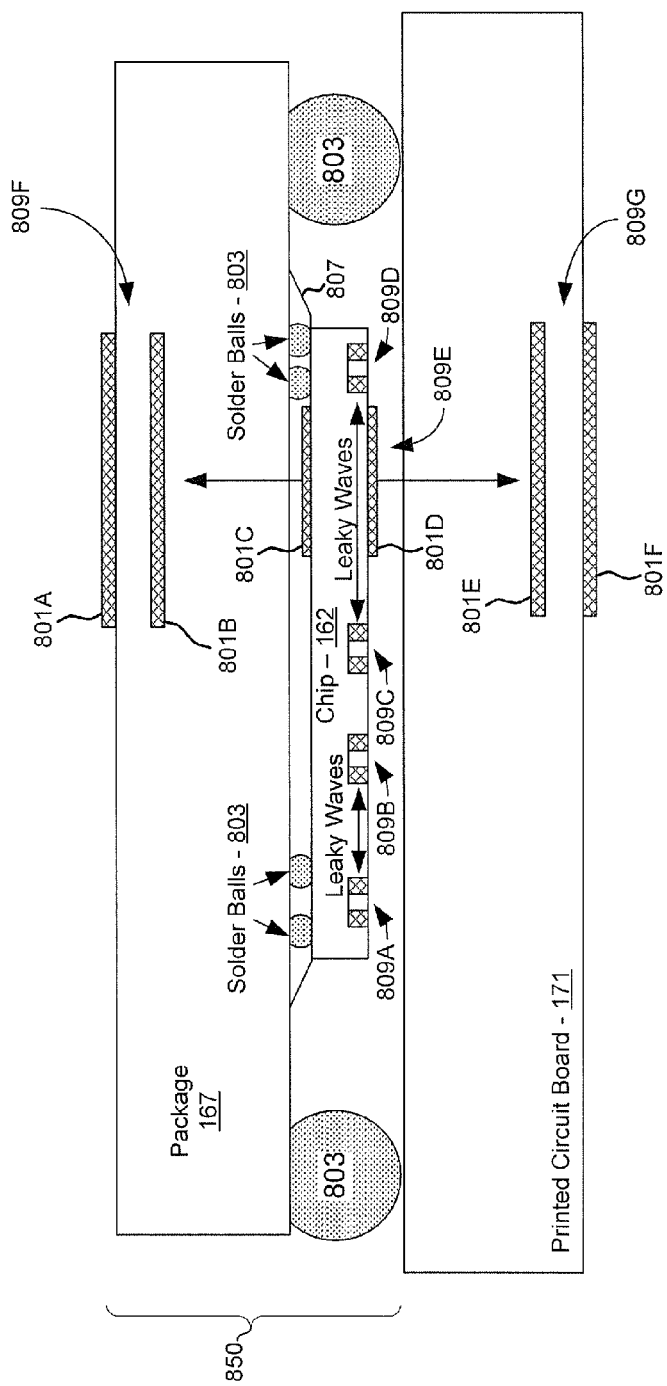
FIG. 8 is a diagram illustrating a cross-sectional view of a packaged integrated circuit with integrated leaky wave antennas, in accordance with an embodiment of the invention.

FIG. 8 is a diagram illustrating a cross-sectional view of a packaged integrated circuit with integrated leaky wave antennas, in accordance with an embodiment of the invention. Referring to FIG. 8, there is shown a packaged integrated circuit 850 mounted on PCB 171. The packaged integrated circuit comprises metal layers 801A-801D, solder balls 803, an insulating layer 805, thermal epoxy 807, and leaky wave antennas 809A-809F. Also shown are metal layers 801E and 801F and the leaky wave antenna 809G on and/or within the PCB 171. Any of the leaky wave antennas 809A-809G may correspond to one of the leaky wave antennas 104 described with respect to FIGS. 1A-7.

The integrated circuit ("chip") 162 may comprise circuitry manufactured on a substrate which may be a semiconductor material. In an exemplary embodiment of the invention, the IC 162 may comprise a system-on-chip such as may be found in one or more of the devices 102.

The package 167 may comprise, for example, a ceramic package. The package 167 may comprise insulating and conductive material, for example, and may provide isolation between electrical components mounted on the package 167. The chip 162 may, for example, be bump-bonded or flip-chip bonded to the package 167 utilizing the solder balls 803. In this manner, wire bonds connecting the chip 162 to the package 167 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167. The metal layers 801A-801F may comprise deposited metal layers utilized to delineate leaky wave antennas in and/or on the chip 162, the package 167, and the printed circuit board 171.

In an embodiment of the invention, the spacing between pairs of metal layers, for example 801A and 801B, 801C and 801D, and 801E and 801F, may define vertical resonant cavities of leaky wave antennas. In this regard, a partially reflective surface, as shown in FIGS. 2 and 3, for example, may enable the resonant electromagnetic mode in the cavity to leak out from that surface. In this manner, leaky wave antennas may be operable to communicate wireless signals to and/or from the chip 162 to the package 167 and/or the printed circuit board 171, and/or to external devices.

The metal layers 801A-801F may comprise microstrip structures as described with respect to FIG. 7. The region between the metal layers 801A-801F may comprise a resistive material that may provide electrical isolation between the metal layers 801A-801F thereby creating a resonant cavity.

The number of metal layers is not limited to the number of metal layers 801A-801F shown in FIG. 8. Accordingly, there may be any number of layers embedded within and/or on the chip 162, the package 167, and/or the printed circuit board 171, depending on the number of leaky wave antennas, traces, waveguides and other devices fabricated.

The solder balls 803 may comprise spherical balls of metal to provide electrical, thermal and physical contact between the chip 162, the package 167, and/or the printed circuit board 171. In making the contact with the solder balls 803, the chip 162 and/or the package 167 may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162.

Figure 9:
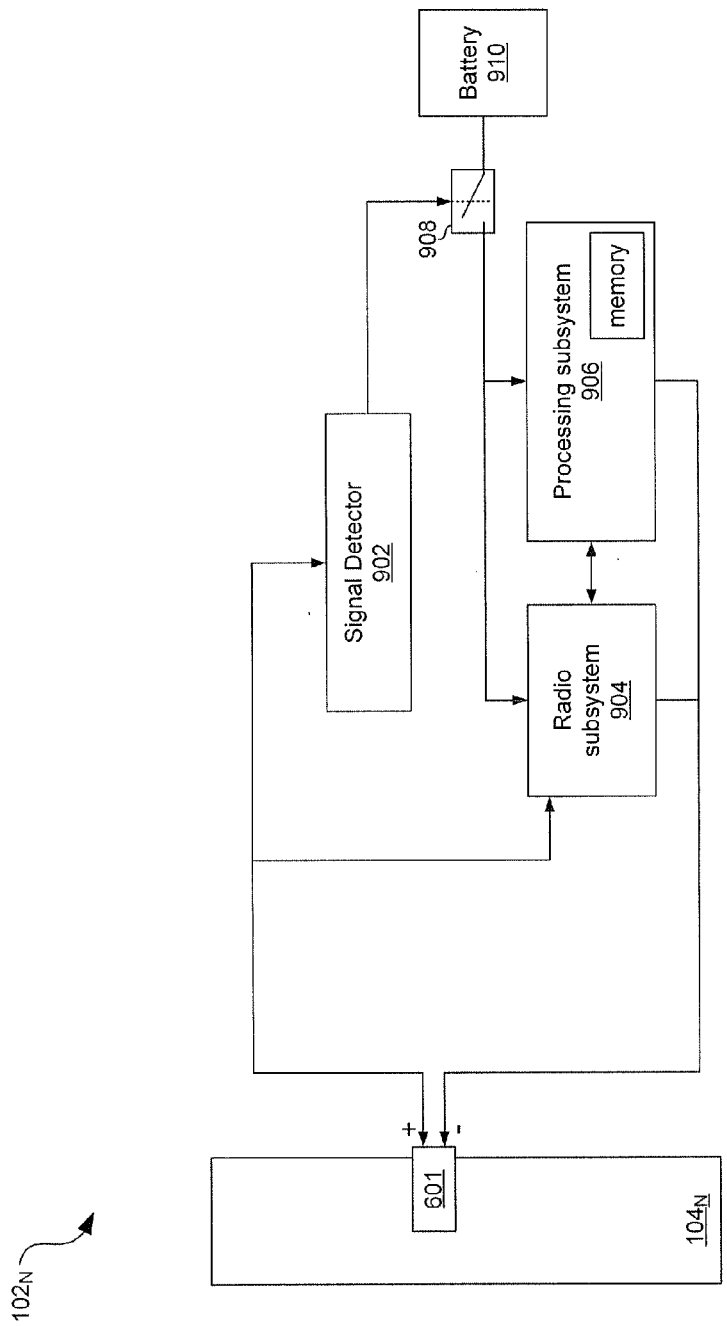
FIG. 9 illustrates an exemplary device operable to communicate over a point-to-point link via a leaky wave antenna, in accordance with an embodiment of the invention.

FIG. 9 illustrates an exemplary device operable to communicate over a point-to-point link via a leaky wave antenna, in accordance with an embodiment of the invention. Referring to FIG. 9, the device $102_N$ comprises the leaky wave antenna $104_N$, switch 908, signal detector 902, radio subsystem 904, and processing subsystem 906.

The leaky wave antenna $104_N$ may be as described in FIGS. 1A-8. The switch 908 may comprise, for example, MOSFET switches, or MEMS switches.

The signal detector 902 may comprise suitable logic, circuitry, interfaces, and/or code that may be operable to detect RF energy received via the leaky wave antenna $104_N$ and, if the signal is of sufficient strength, generate a control signal to close the switch 908. When the switch is closed, the battery 106 may be connected to the radio subsystem 128 and the processing subsystem 130, thus powering on the transponder 100. In an exemplary embodiment of the invention, the signal detector may comprise a filter to set a frequency response of the signal detector 902 and one or more diodes and/or capacitors and may accumulate a charge on a capacitor in the presence of an RF signal having the appropriate frequency and/or characteristics.

The radio subsystem 904 may comprise suitable logic, circuitry, interfaces, and/or code that may be operable to receive RF signals and detect information impressed on the received RF signals. In this regard, the radio subsystem 904 may demodulate an RF signal received via the leaky wave antenna 104 and output the corresponding baseband signal to the processing subsystem 906. Additionally, the radio subsystem 904 may comprise suitable logic, circuitry, interfaces, and/or code to modulate baseband signals from the processing subsystem 906 onto one or more RF carriers, and transmit the modulated signal(s) via the leaky wave antenna $104_N$.

The processing subsystem 906 may comprise suitable logic, circuitry, interface(s), and/or code that may be enabled to process baseband signals received from the radio subsystem 904 and generate baseband signals which may be utilized by the radio subsystem 904 to modulate a transmitted signal. The processing subsystem 906 may generate signals to control operation of the device 106. Control and/or data information utilized for processing received data and for generating data to be transmitted may be stored in memory in the processing subsystem 906. For example, boot code and/or instructions for operation of the device 102 may be stored in and executed by the processing subsystem 906.

In various embodiments of the invention, the radio subsystem 904 and/or the processing subsystem 906 may be operable to implement one or more wireless communication protocols such as Bluetooth and/or wireless USB.

In operation, an RF signal may be received via the leaky wave antenna 104 and charge may accumulate on one or more capacitors in the signal detector 902 until a sufficient voltage is built up to close the switch 908. Upon power up, the radio subsystem 904 may begin demodulating the received RF signal and the resulting baseband signal may be conveyed to the processing subsystem 906. The processing subsystem 906 may process the received baseband signal and perform an appropriate action in response. For example, the received baseband signal may comprise a request to establish a connection and the processing subsystem 906 may determine whether to accept the connection request and generate an appropriate response message. After a connection is established, the received baseband signal may comprise commands and/or requests and the processing subsystem may process the commands and/or requests. In response to the commands and/or requests the processing subsystem may perform corresponding operations and/or generate appropriate response messages, as the communication protocol may dictate. The various messages received and/or transmitted by the device $102_N$ may be formatted and/or otherwise communicated in accordance with one or more wireless protocols such as Bluetooth and/or wireless USB.

Figure 10:
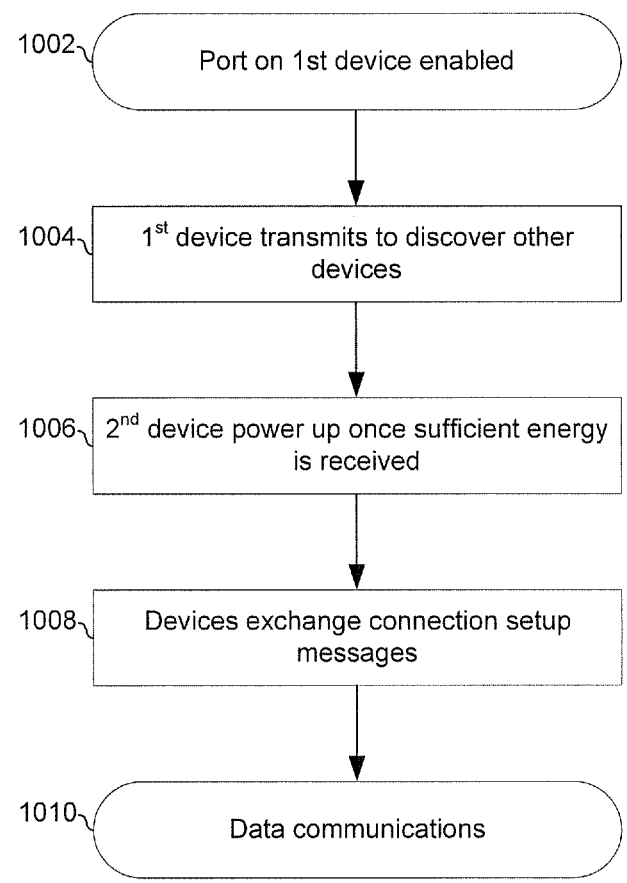
FIG. 10 is a flow chart illustrating exemplary steps for point-to-point communication via leaky wave antennas, in accordance with an embodiment of the invention.

FIG. 10 is a flow chart illustrating exemplary steps for point-to-point communication via leaky wave antennas, in accordance with an embodiment of the invention. Referring to FIG. 10, the exemplary steps may begin with step 1002 when a communication port of a device $102_1$ may be enabled. The port may comprise a leaky wave antenna $104_1$. In step 1004, the device $102_1$ may begin transmitting a signal. In various embodiments of the invention, the signal may be at or near 60 GHz. In various embodiments of the invention, the discovery signal may be generated in accordance with wireless communication protocols such as Bluetooth and/or wireless USB, for example. In step 1006, the signal transmitted by the device $102_1$ via the leaky wave antenna $104_1$ may be incident on the leaky wave antenna $104_2$ of a device $104_2$. Energy of the received signal may cause charge to accumulate on a capacitor in the device $104_2$ and the device $104_2$ may power up when a sufficient charge has built up. In this regard, in various embodiments of the invention, the device may be calibrated such sufficient energy to power up the device $104_2$ is only received when the antenna $104_1$ and the antenna $104_2$ are within a threshold distance and/or are sufficiently aligned. In step 1008, the devices $104_1$ and $104_2$ may exchange messages to establish a wireless connection. The messages may adhere to one or more wireless protocols such as Bluetooth or wireless USB, for example. In step 1010, after a connection has been established, data may be communicated via the connection.

Various aspects of a method and system for point-to-point communications links utilizing leaky wave antennas are provided. In an exemplary embodiment of the invention, a first device $102_1$ may transmit a RF signal via a leaky wave antenna $104_1$, and may determine an angle between the leaky wave antenna $104_1$ of the first device $102_1$ and a leaky wave antenna $104_2$ of a second device $102_2$ by adjusting a frequency of the transmitted RF signal until a response is received from the second device $102_2$. The first device $102_1$ and/or the second device $102_2$ may be configured based on the determined angle. A wireless connection may be established between the leaky wave antenna $104_1$ of the first device and the leaky wave antenna $104_2$ of the second device $102_2$ based on the configuration. The radio frequency signal may be at or near 60 GHz. Each of the leaky wave antennas $104_1$ and $104_2$ may be integrated within and/or on an integrated circuit 162 and/or an integrated circuit package 167. The first device $102_1$ may generate a notification when the angle is beyond a threshold. The wireless connection may adhere to wireless USB protocols and/or Bluetooth protocols, for example. Configuring the first device $102_1$ may comprise tuning one or more filters $109_1$. The second device $102_2$ may generate the response after receiving sufficient energy from the RF signal. The second device may configure one or more filters $109_2$ based on received signal strength of the RF signal.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a point-to-point wireless communications utilizing leaky wave antennas.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

Aspects of the present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
   in a first device comprising a first leaky wave antenna:
   transmitting a discovery signal at a frequency that corresponds to a transmission angle;
   adjusting said frequency of said discovery signal to change said transmission angle;
   receiving a radio frequency (RF) signal via said first leaky wave antenna, wherein said RF signal is received from a second leaky wave antenna of a second device;
   determining an angle between said first leaky wave antenna and said second leaky wave antenna based on a received signal strength of said RF signal;
   pairing with said second device to establish a communication protocol connection between said first device and said second device when said determined angle is approximately equal to a particular angle; and
   preventing pairing with said second device to prevent establishment of a communication protocol connection between said first device and said second device when said determined angle is not approximately equal to said particular angle,
   wherein said second device powers up in response to receiving energy exceeding a threshold from said discovery signal.

2. The method according to claim 1, wherein said leaky wave antenna of said first device is integrated within and/or on an integrated circuit.

3. The method according to claim 1, wherein said leaky wave antenna of said first device is integrated within and/or on an integrated circuit package.

4. The method according to claim 3, comprising generating a notification when said particular angle is beyond a threshold.

5. The method according to claim 1, wherein one or more filters of said first device are configured based on said particular angle.

6. The method according to claim 1, wherein said second device configures one or more filters based on said received signal strength of said RF signal.

7. A system for communication, the system comprising:
   one or more circuits in a first device, said one or more circuits comprising a first leaky wave antenna, and said one or more circuits configured to:
   transmit a discovery signal at a frequency that corresponds to a transmission angle;
   adjust said frequency of said discovery signal to change said transmission angle;
   receive a radio frequency (RF) signal via said first leaky wave antenna, wherein said RF signal is received from a second leaky wave antenna of a second device;
   determine an angle between said first leaky wave antenna and said second leaky wave antenna based on a received signal strength of said RF signal;
   pair with said second device to establish a communication protocol connection between said first device and said second device when said determined angle is approximately equal to a particular angle; and
   prevent pairing with said second device to prevent establishment of a communication protocol connection between said first device and said second device when said determined angle is not approximately equal to said particular angle;
   one or more additional circuits in said second device and configured to power up said second device in response to receiving energy exceeding a threshold from said discovery signal.

8. The system according to claim 7, wherein said leaky wave antenna of said first device is integrated within and/or on an integrated circuit.

9. The system according to claim 7, wherein said leaky wave antenna of said first device is integrated within and/or on an integrated circuit package.

10. The system according to claim 7, wherein said one or more circuits are operable to generate a notification when said particular angle is beyond a threshold.

11. The system according to claim 7, wherein one or more filters of said first device are configured based on said particular angle.

12. The system according to claim 7, wherein said second device configures one or more filters based on said received signal strength of said RF signal.

13. A communication device, the communication device comprising:
   a processor configured to:
   transmit a discovery signal at a frequency that corresponds to a transmission angle;
   adjust said frequency of said discovery signal to change said transmission angle;
   receive a response signal from a second device;
   determine an angle between the communication device and a communication partner based on a received signal strength of the response signal;
   establish a communication protocol connection between the communication device and the communication partner if the determined angle is less than a threshold; and
   prevent a communication protocol connection between the communication device and the communication partner if the determined angle is greater than a threshold,
   wherein said discovery signal causes second device to power up in response to energy from said discovery signal exceeding a threshold.

14. The communication device of claim 13, wherein the processor is configured to stop changing the frequency of the transmitted discovery signal when a maximum transmission angle is reached prior to receiving the response signal from the communication partner.

* * * * *